(12) United States Patent
Ashida

(10) Patent No.: US 6,567,449 B1
(45) Date of Patent: May 20, 2003

(54) SEMICONDUCTOR LASER AND METHOD FOR MANUFACTURING THE SAME

(75) Inventor: Masayoshi Ashida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 142 days.

(21) Appl. No.: 09/651,057

(22) Filed: Aug. 30, 2000

(30) Foreign Application Priority Data

Aug. 31, 1999 (JP) .......................... 11-244546

(51) Int. Cl.[7] .............................. H01S 5/00; H01S 3/10; H01L 21/00
(52) U.S. Cl. ............................ 372/50; 372/46; 372/23; 438/22; 438/28
(58) Field of Search ............................ 372/50, 46, 45, 372/23; 438/22, 28

(56) References Cited

U.S. PATENT DOCUMENTS

| | | | |
|---|---|---|---|
| 4,607,370 A | * | 8/1986 | Mukai et al. ................. 372/50 |
| 5,212,706 A | * | 5/1993 | Jain ............................. 372/50 |
| 5,459,746 A | * | 10/1995 | Itaya et al. .................... 372/46 |

* cited by examiner

Primary Examiner—Quyen Leung
(74) Attorney, Agent, or Firm—Arent Fox Kintner Plotkin & Kahn PLLC

(57) ABSTRACT

A group of semiconductor layers of a first light emitting region(6) including an active layer(3), determined by a first wavelength of laser beam, sandwiched between two cladding layers(2) and(4) of which the band gap is greater than that of the active layer(3) are deposited on a semiconductor substrate 1. Similarly, another group of semiconductor layers of a second light emitting region(16) including an active layer(13), determined by a second wavelength of laser beam, sandwiched between two cladding layers(12) and(14) of which the band gap is greater than that of the active layer 13 are deposited via a contact layer(5) on the first light emitting region(6). The first and the second light emitting region(6) and (16) are aligned with each other along the perpendicular (vertical) to the semiconductor substrate(1). Accordingly, a multi-color semiconductor laser having multiple laser beam sources in their respective light emitting regions aligned along the vertical to the substrate can be fabricated by simple steps of production.

6 Claims, 5 Drawing Sheets

SEMICONDUCTOR LASER AND METHOD FOR MANUFACTURING THE SAME

FIELD OF THE INVENTION

The present invention relates to a semiconductor laser used in a read-out apparatus such as a DVD (digital video disk) drive or a CD (compact disk) drive for oscillating in a wavelength range of visible red light or infrared ray. Particularly, it relates to a semiconductor laser having a one-chip structure which is easily fabricated by simple steps and emits different wavelength laser beams, which are aligned in the perpendicular direction to the substrate.

BACKGROUND OF THE INVENTION

Semiconductor laser is commonly used in CD or DVD drive for reading and writing dada, in which laser beam of 780 nm wavelength for CD drive or of 650 nm wavelength for DVD drive is used as a light source. In an apparatus for reading data from both a CD disk and a DVD disk, a light source is desired to emit two different wavelength laser beams, specifically 780 nm and 650 nm. Such a light source for emitting two beams of different wavelength is disclosed as a semiconductor laser of chip type (referred to as an LD hereinafter) in Japanese Patent Laid-open Publication Hei 1-67992 and illustrated in FIG. 4.

There are an n-type cladding layer 32, an active layer 33, a p-type cladding layer 34, and a cap layer 35 of p-type GaAs deposited on an n-type GaAs substrate 31, thus forming a first light emitting region 36. Similarly, an n-type cladding layer 38, an active layer 39, a p-type cladding layer 40, which are made of different materials from those of the previous layers, and a cap layer 41 of p-type GaAs are deposited at the side on the substrate 31, thus forming a second light emitting region 42. And the light emitting regions are shaped of a ridge structure, the upper surfaces of the first and second light emitting regions 36 and 42 and the back surface of the substrate 31 are covered with electrodes 43, 44, and 45 respectively. A resultant semiconductor laser has two light emitting regions developed on the single substrate for emission of two different wavelength laser beams. However, as shown in the Japanese Patent Laid-open Publication 7-67992, the semiconductor laser of such a structure is fabricated by depositing the semiconductor layers.of the first light emitting region 36 on the substrate, and then removing unwanted portions by etching, and selectively growing the second semiconductor layers for the second light emitting region 42 by providing polycrystalline layer so that the second semiconductor layers do not grow on the first light emitting region 36.

Alternatively, another semiconductor light emitting device is disclosed in Japanese Patent Laid-open Publication Hei 7-263752 and illustrated in FIG. 5, which is fabricated by depositing on the semiconductor substrate 51 a stack of semiconductor layers 52, 53, and 54 for light emitting regions, etching the layers to have a step structure, and providing patterns of electrodes 55 to 58 on the back side of the substrate 51 and the upper sides of the stepped layers exposed by etching. This arrangement allows the laminated semiconductor layers to be etched at one time as compared with the above manners in which selectively etching unwanted portions of the previously deposited semiconductor layers and then depositing another group of the semiconductor layers, and its production will be facilitated.

As explained, the semiconductor lasers for emission of two different wavelength beams are implemented with two different light emitting regions developed side by side on the same substrate and with two different light emitting regions developed by depositing the semiconductor layers and etching them to have a step structure.

However, in the former, the second light emitting region is fabricated by etching unwanted portions of the previously deposited layers of the first light emitting region to expose the semiconductor substrate and then depositing another group of the layers by avoiding the first light emitting area to form the second light emitting region on the substrate. Hence, its production requires a significant number of steps and may hardly deposit the semiconductor layers of good crystalline characteristics through selectively growing crystals to form the second light emitting region beside the first light emitting region, thus failing to provide a higher level of illumination.

In the latter, when the semiconductor laser is fabricated in the form of a ridge structure or an SAS structure having current blocking layer embedded as self-aligned, its light emitting regions have to be configured one by one through their respective etching steps and its production will thus be complex. In addition, as shown in FIG. 5, the structure of the semiconductor laser may cause the laser beam from each light emitting region to be not only deflected from the x direction but also dislocated to the z direction. Accordingly, the installation and alignment of this semiconductor laser with focusing lenses will be made much difficult.

SUMMARY OF THE INVENTION

It is an object of the present invention to provide a multi-color semiconductor laser which while eliminating the foregoing drawbacks, allows multiple sources of different wavelength laser beams at corresponding light emitting regions to be aligned along the vertical to the substrate and can be fabricated by simple steps of production.

It is another object of the present invention to provide a method of readily fabricating a multi-color semiconductor laser in which multiple sources for emitting different laser beams at corresponding light emitting regions are aligned with each other along the vertical to the substrate.

A semiconductor laser according to the present invention comprises: a semiconductor substrate; a first light emitting region of semiconductor layers provided on the semiconductor substrate, the semiconductor layers having an active layer, determined by a first wavelength of laser beam, sandwiched between two cladding layers of which the band gap is greater than that of the active layer; and a second light emitting region of semiconductor layers provided on the first light emitting region, the semiconductor layers having an active layer, determined by a second wavelength of laser beam, sandwiched between two cladding layers of which the band gap is greater than that of the active layer, wherein the first light emitting region and the second light emitting region are aligned with each other along the perpendicular to the semiconductor substrate. Three or more of the light emitting regions may be added with equal success.

As the first and second light emitting regions are aligned vertically, they can simply be fabricated as compared with the conventional steps of etching a portion of a group of semiconductor layers and then depositing another group of semiconductor layers. Also, the laser beam generating points are aligned along the vertical to the semiconductor substrate and their different wavelength laser beams can be focused with a single lens thus contributing to the compactness and precision of an optical pickup apparatus.

The first and second light emitting regions may be formed of a ridge structure. This allows the current injection area to be defined in a desired range thus permitting a resultant semiconductor laser to have a low threshold and provide a higher level of performance. The two ridge structures of the first and second light emitting regions can readily be fabricated by a single action of etching, hence shortening the procedure of production.

More specifically, a semiconductor laser comprises:

a semiconductor substrate of a first conductivity type;

a first light emitting region provided on the semiconductor substrate, the first light emitting region comprising a cladding layer of the first conductivity type, an active layer, and a cladding layer of a second conductivity type; a first contact layer of the second conductivity type provided on the first light emitting region; a second light emitting region provided on the first contact layer, the second light emitting region comprising a cladding layer of the second conductivity type, an active layer, and a cladding layer of the first conductivity type; a recess arranged to define a ridge structure of the semiconductor layers which include the cladding layer of the second conductivity type in the first light emitting region, the first contact layer, and all the semiconductor layers in the second light emitting region; a first electrode forming layer of the second conductivity type embedded over a current blocking layer of the first light emitting region in the recess so as to electrically connect with the first contact layer; and a second contact layer of the first conductivity type electrically connected with the cladding layer of the first conductivity type in the second light emitting region and provided over a current blocking layer which is seated on a part of the first electrode layer, embedded in the recess to cover the sides of the ridge structure of the second light emitting region, and forms a hetero barrier blocking structure with the cladding layer of the second conductivity type and the active layer in the second light emitting region.

It may be modified in which each of the first and second light emitting regions includes a current blocking layer which has a stripe groove provided therein, the two stripe grooves in the first and second light emitting regions aligned along the perpendicular to the semiconductor substrate.

It may also be modified in which the first and second light emitting regions are joined with each other by a semiconductor layer of the same conductivity type while an upper electrode of the first light emitting region and a lower electrode of the second light emitting region are formed of a common layer.

A method for manufacturing a semiconductor laser according to the present invention comprises the steps of:

(a) depositing on a semiconductor substrate a group of semiconductor layers incorporating a first light emitting region, a first contact layer, and another group of semiconductor layers incorporating a second light emitting region in a sequence; (b) etching from the surface of the semiconductor layers to a depth in the first light emitting region to shape the first and second light emitting regions to a ridge structure which is a current injection area; (c) depositing on both sides of the current injection area of the ridge structure shaped by the etching, a first current blocking layer for blocking a flow of current in the first light emitting region, a first electrode forming layer connected to the first contact layer, and a second current blocking layer for blocking a flow of current in the second light emitting region in a sequence; (d) depositing a second contact layer on the another group of semiconductor layers and the second current blocking layer; and (e) etching partially the second contact layer and the second current blocking layer to expose a portion of the first electrode layer.

It may be modified in which depositing the another group of semiconductor layers with the structure of at least an active layer sandwiched between an n-type cladding layer and a p-type cladding layer, and depositing the second current blocking layer with a semiconductor having a hetero barrier blocking structure with the active layer and n-type and p-type cladding layers, directly on both sides of the active layer and the cladding layers. This facilitates embedding the current blocking layer. The hetero barrier blocking structure means such a specific combination of semiconductor layers that a difference in the band gap is great enough to inhibit the flow of current at a common operating voltage.

DETAILED DESCRIPTION

Figure 1:
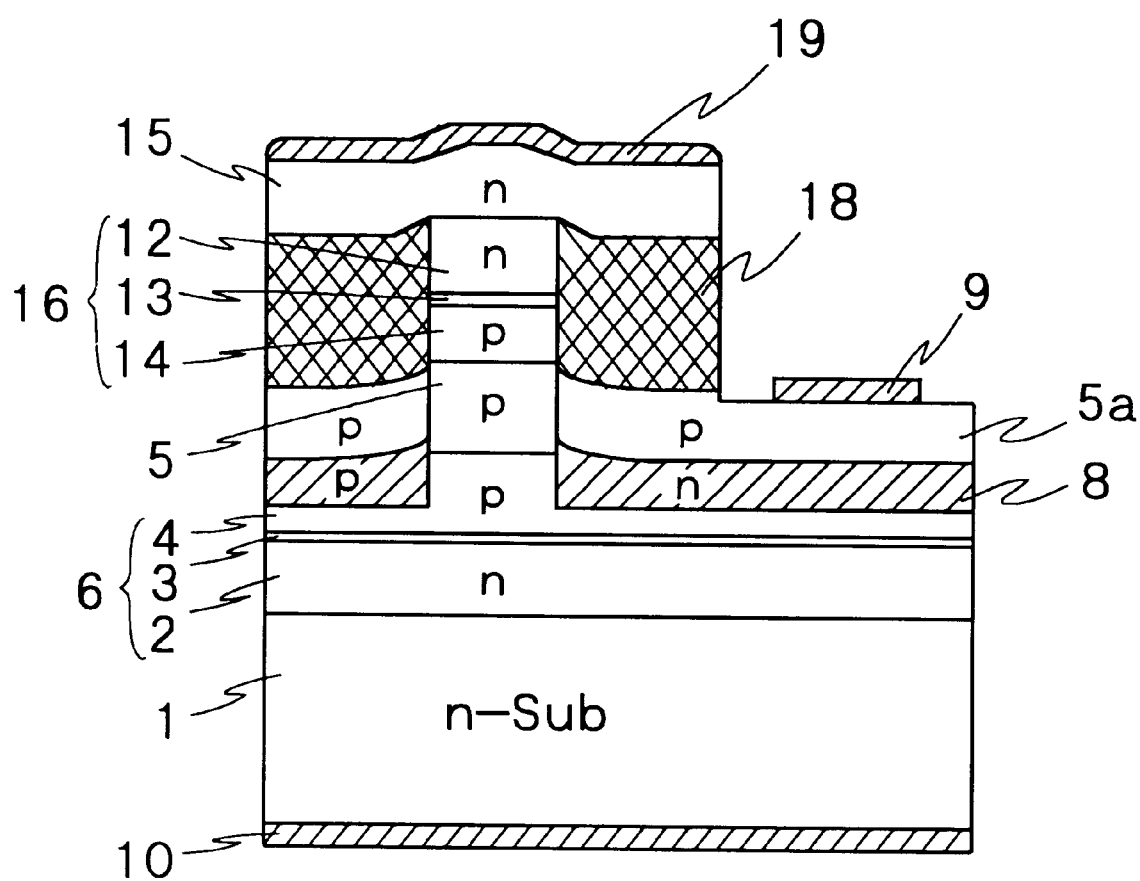
FIG. 1 is an explanatory cross sectional view illustrating one embodiment of a semiconductor laser of the present invention.

As its embodiment is shown in an explanatory cross sectional view of FIG. 1, a semiconductor laser according to the present invention includes a first light emitting region 6 of the semiconductor layer structure which is provided on a semiconductor substrate 1 and comprises an active layer 3 determined by a first wavelength of laser beam and sandwiched between two cladding layers 2 and 4 of which the band gap is greater than that of the active layer 3. A second light emitting region 16 of the semiconductor layer structure is provided via a first contact layer 5 on the first light emitting region 6 which comprises an active layer 13 determined with a second wavelength of laser beam and sandwiched between two cladding layers 12 and 14 of which the band gap is greater than that of the active layer 13. The first light emitting region 6 and the second light emitting region 16 are aligned along the perpendicular (vertical) to the semiconductor substrate 1.

In the embodiment shown in FIG. 1, the first and the second light emitting regions 6 and 16 are formed of a bridge structure where current blocking layers are deposited in its recesses. More specifically, a first current blocking layer 8 in the first light emitting region 6 is implemented by a reverse semiconductor layer (having a reversed pn junction) and is covered with a first electrode forming layer 5a of p-type GaAs for electrically connecting with the first contact layer 5. A second current blocking layer 18 in the second light emitting region 16 is implemented by a hetero-barrier blocking (HBB) structure semiconductor layer, of which the band gap acting as a hetero-barrier is greater, provided for contacting directly with the p-type cladding layer 14, the active layer 13, and the n-type cladding layer 12 of the second light emitting region 16.

Figure 2:
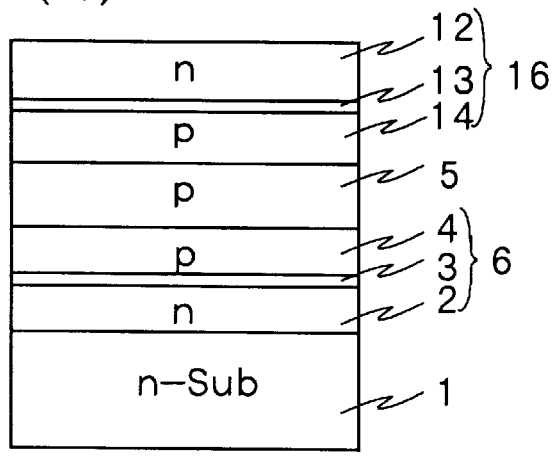
FIGS. 2a to 2e are explanatory cross sectional views illustrating steps of fabricating the semiconductor laser shown in FIG. 1.
Figure 2:
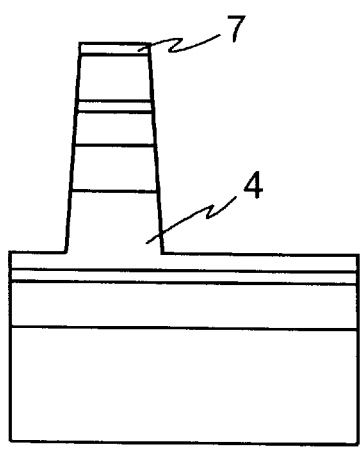
Figure 2:
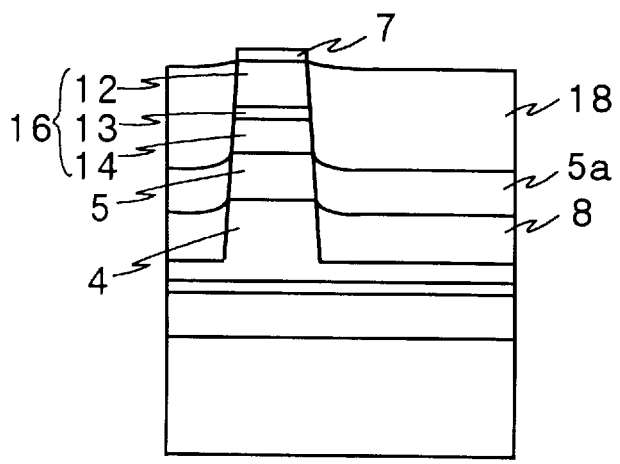

As the light emitting regions are formed of each a ridge structure, their semiconductor layers can simply be deposited in a sequence and etched to form each ridge structure of the light emitting region when not only two but also three or more wavelengths of a chip device is desired. Accordingly, the production of the device will be made simple because the ridge structure of each light emitting device is shaped by the same manner. For more simplicity of the production, it is desired to have the current blocking layer of any light emitting region above the second light emitting region arranged of a HBB semiconductor layer for developing a significant hetero-barrier, like the current block layer 18 in the second light emitting region 16. The production will now be explained in more detail referring to the steps shown in FIG. 2.

As shown in FIG. 2(a), the procedure starts with placing an n-type GaAs substrate 1 in a MOCVD (metallic organic chemical vapor deposition) container, for example, and depositing on the substrate 1 an n-type cladding layer 2 of $In_{0.49}(Ga_{1-z}Al_z)_{0.51}P$ ($0.5 \leq z \leq 0.8$ and preferably z=0.7) to a thickness of about 1.5 to 2 μm, an active layer 3 of $InGaP/In_{0.49}(Ga_{1-u}Al_u)_{0.51}P$ ($0.3 \leq u \leq 0.7$ and preferably u=0.4), of which the first wavelength of laser beam is 650 nm and which has a multi-quantum well structure, to a thickness of about 0.1 μm, and a p-type cladding layer 4 of $In_{0.49}(Ga_{1-z}Al_z)_{0.51}P$ ($0.5 \leq z \leq 0.8$ and preferably z=0.7) to a thickness of substantially 1.5 to 2 μm thus to develop the first light emitting region 1. Then, a first contact layer 5 of p-type GaAs is deposited to a thickness of about 1 to 2 μm.

This is followed by depositing a p-type cladding layer 14 of $Al_xGa_{1-x}As$ ($0.4 \leq x \leq 0.7$ and preferably x=0.6) to a thickness of about 1.5 to 2 μm, an active layer 13 of $Al_yGa_{1-y}As$ ($0 \leq y \leq 0.2$ and preferably y=0.1), of which the second wavelength of laser beam is 780 nm, to a thickness of about 0.1 μm, and an n-type cladding layer 12 of $Al_xGa_{1-x}As$ ($0.4 \leq x \leq 0.7$ and preferably x=0.6) to a thickness of about 0.5 to 1 μm thus to develop the second light emitting region 16 of a double hetero structure.

Next, a masking layer of e.g. $SiO_2$ is deposited over the surface of the cladding layer 12 by a CVD method and covered with a pattern of photoresist to form a masking 7 on a portion of the ridge where the light emitting region is developed. The semiconductor layers are then etched down to an intermediate depth of the p-type cladding layer 4 in the first light emitting region 6 with the use of sulfuric acid, hydrogen peroxide solution, and hydrochloric acid, as shown in FIG. 2(b). As a result, the light emitting region is formed of a ridge structure and the remaining region not covered by the masking 7 has been removed. For preventing excess of the etching over the p-type cladding layer 4, the intermediate depth of the p-type cladding layer 4 in the first light emitting region 6 may be determined by an etching inhibit layer of e.g. p-type InGaP having a thickness of about 0.05 μm, not shown, which has been inserted during the previous step of depositing the semiconductor layers.

This is further followed by placing the resultant wafer with the masking 7 in the semiconductor deposition apparatus such as MOCVD container and, as shown in FIG. 2(c), filling recesses provided by the etching for forming the ridge (which are shown not in a recessed shape in the drawings as situated on both sides of the ridge, each recess being defined by two adjacent ridges) with first and second current blocking layers 8 and 18. More particularly, the first current blocking layer 8 having a reverse pn junction is deposited by selectively growing n-type GaAs at such a location that it directly covers the p-type cladding layer 4 in the first light emitting region 6. Then, a first electrode forming layer 5a of e.g. p-type GaAs is deposited on the first current blocking layer 8 so that it comes into direct contact with the first contact layer 5. Finally, a second current blocking layer 18 of $In_{0.49}(Ga_{1-v}Al_v)_{0.51}P$ ($0 \leq v \leq 1$) is deposited to cover the p-type cladding layer 14, the active layer 13, and the n-type cladding layer 12 in the second light emitting region 16, thus forming a hetero barrier blocking (HBB) structure.

Figure 2D:
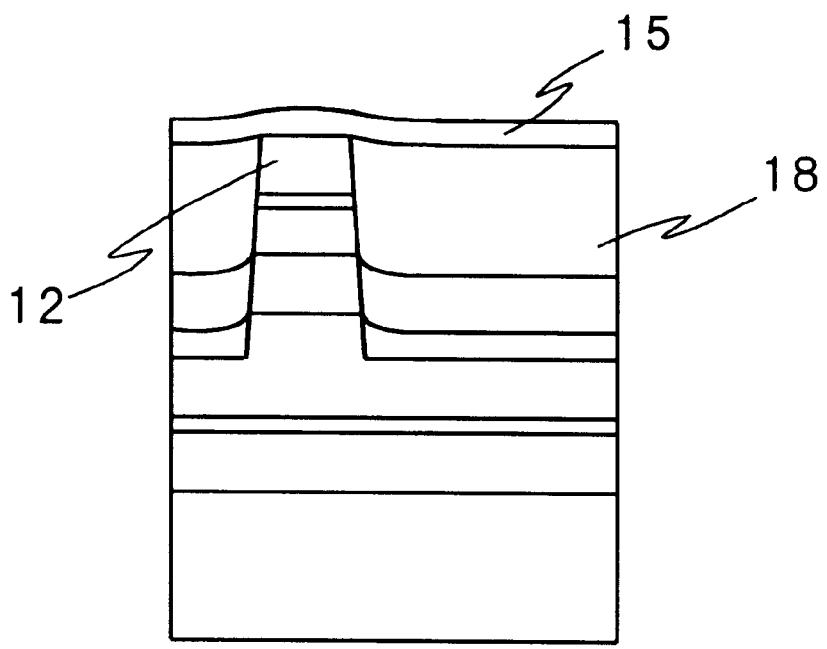

The wafer is then taken out from the semiconductor deposition apparatus and the masking 7 of $SiO_2$ is removed off from the wafer using fluoric acid or the like. This is followed by placing the wafer in the MOCVD container and depositing a second contact layer 15 of n-type GaAs to a thickness of substantially 1 μm as shown in FIG. 2(d).

Figure 2E:
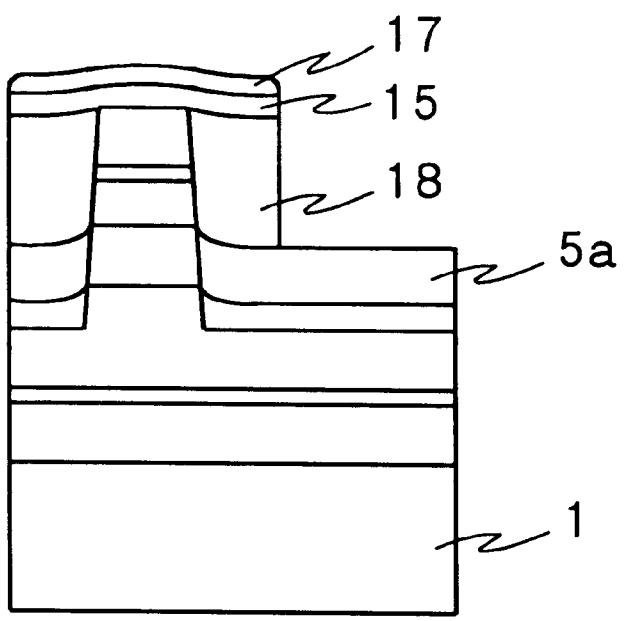

Then, a pattern of resist film is deposited on the surface of the wafer to form a masking 17. The second current blocking layer 18 and the second contact layer 15 are partially etched about the second light emitting region 16 with the use of a mixture of sulfuric acid and hydrogen peroxide solution thus to expose a portion of the first electrode forming layer 5a electrically connected to the first contact layer 5, as shown in FIG. 2(e). Then, the masking 17 is removed off and electrodes 10, 9, and 19 are provided on the back side of the semiconductor substrate 1, the exposed portion of the first electrode forming layer 5a, and the second contact layer 15 (a second electrode forming layer) at the top surface of the second light emitting region 16 respectively. As a result, the semiconductor laser of two-wavelength, one-chip type shown in FIG. 1 is completed, which is two light emitting regions for emission of different wavelength laser beams aligned along the perpendicular or vertical to the semiconductor substrate.

While the above description is based on a two-wavelength, one-chip type, three or more light emitting regions for emission of multiple wavelength laser beams may successfully be built as one chip by the same manner of depositing the semiconductor layers. In that case, each current blocking layers above the first light emitting region are formed of a hetero barrier blocking structure, thus contributing to the simplification of the production method.

According to the present invention, as two or more light emitting regions for different wavelength of radiation are aligned along the vertical, their laser beams are aligned in line along the perpendicular to the semiconductor substrate and can thus be focused with a single focusing lens. As its optical axis is easily controlled, the semiconductor laser can be highly usable. Also, while such a troublesome procedure of depositing a group of semiconductor layers to form the first light emitting region, removing a particular portion of the group by etching, and depositing another group of semiconductor layers to form the second light emitting region is eliminated, the semiconductor layers can readily be deposited in a sequence, hence making the procedure of production simpler and decreasing the cost of the production.

As the current injection area of each light emitting region is formed of a ridge structure, the light emitting regions extend vertically in layers and can thus be configured to a ridge structure simultaneously by a single action of etching. Therefore, the procedure of its production will be facilitated.

Using the method of the present invention, a one-chip semiconductor laser having two or more light emitting regions can be fabricated by simple steps and also, its light emitting regions formed of a ridge structure can be configured simultaneously by a single action of etching thus to be vertically aligned with each other at higher precision. Accordingly, the semiconductor laser will be improved in the quality while decreased in the cost.

Figure 3:
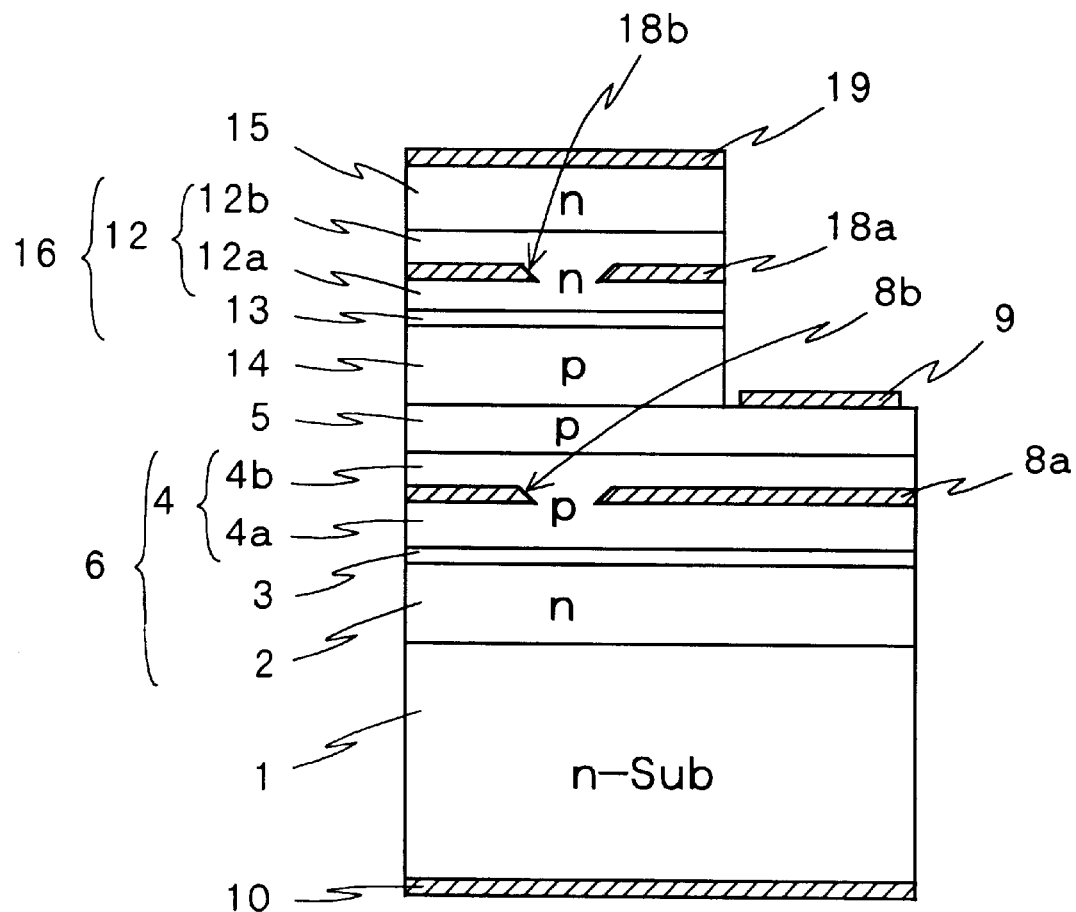
FIG. 3 is an explanatory cross sectional view illustrating another embodiment of a semiconductor laser of the present invention.
Figure 4:
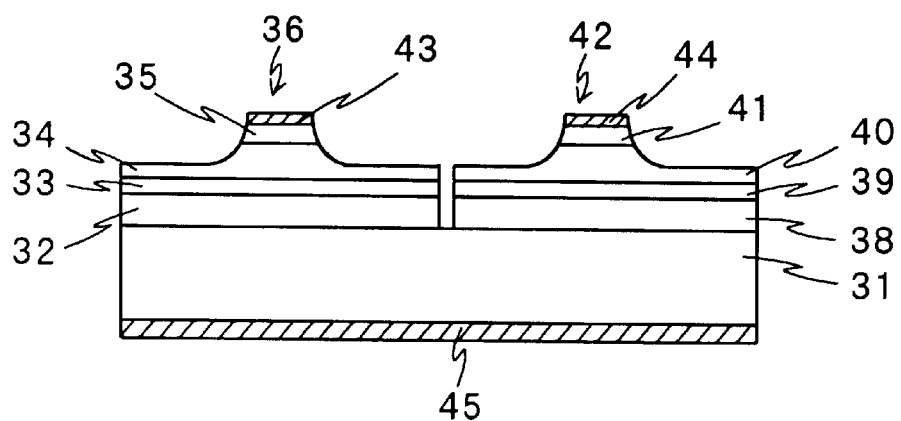
FIG. 4 is an explanatory cross sectional view of a conventional two-wavelength, one-chip semiconductor laser.
Figure 5:
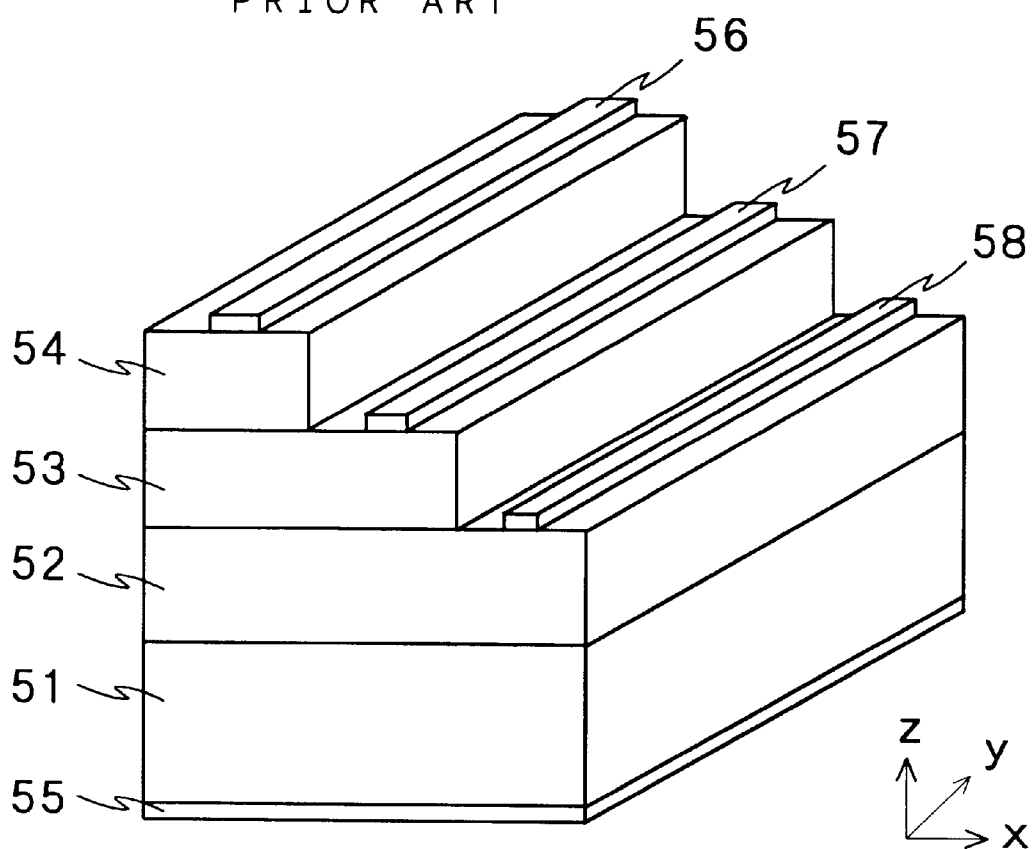
FIG. 5 is an explanatory perspective view of another conventional three-wavelength, one-chip semiconductor laser.

While the embodiment is not limited to the ridge structure which allows the one-chip semiconductor laser having multi-wavelength light emitting regions to be fabricated by the simple steps, an SAS structure having current blocking regions therein such as shown in FIG. 3 may successfully be utilized for fabricating an equally usable multi-wavelength one-chip semiconductor laser with its light emitting regions provided one over the other along the vertical.

In FIG. 3, like components are denoted by like numerals as those shown in FIG. 1 and will be explained in no more detail. An n-type cladding layer 2 and an active layer 3 are deposited on an n-type GaAs substrate 1 by the same manner as of the previous embodiment. Then, a p-type cladding layer as a first cladding layer 4a of about 0.3 µm thick and a current blocking layer 8a of n-type GaAs or InAlP are deposited before taken out from a semiconductor deposition apparatus. A resultant assembly is masked with a resist film and etched to provide a stripe groove 8b. This is followed by depositing a second p-type cladding layer 4b of about 1.5 µm thick and a first contact layer 5 of the same composition and thickness as of the previous embodiment in the semiconductor deposition apparatus. This procedure of steps is then repeated to develop a second light emitting region 16. In this procedure, a current blocking layer 18a having a stripe groove 18b therein is embedded in one of two cladding layers (an n-type cladding 12 in FIG. 3). Accordingly, a vertical semiconductor laser having the SAS structure is completed.

During the deposition of the semiconductor layers for the second light emitting region 16, the active layer 13 may adversely be affected by the presence of a step resulting from the stripe groove 8b in the current blocking layer 8a of a first light emitting region 6. Therefore, care should be taken to have a flatness of the active layer 13.

While the method of depositing the semiconductor layers is not limited to the MOCVD manner described above, any applicable deposition technique such as MBE (molecular beam epitaxy) process may equally be used. Also, the semiconductor layer assembly or the active layer may arbitrarily be formed of an MQW or bulk structure when desired for having specific characteristics. While the light emitting regions are not limited to those arrangement described above, the first light emitting region and the second light emitting region may be provided in a reverse order. In that case, the light emitting regions are basically fabricated of InGaAlP semiconductor materials and its current blocking layer in the HBB structure may be InAlP of which the band gap is greater than that of InGaAlP.

According to the present invention, the semiconductor laser has multi-wavelength light emitting regions aligned with each other along the perpendicular to the substrate and can thus be favorably utilized in a read-out apparatus compatible with both CD and DVD systems. Also, thanking to the ridge structures of the light emitting regions fabricated simultaneously by a single action of etching, the overall procedure of production can be shortened. As a result, the multi-wavelength one-chip semiconductor laser will be improved in the quality and reduced in the cost.

Although preferred example have been described in some detail it is to be understood that certain changes can be made by those skilled in the art without departing from the spirit and scope of the invention as defined by the appended claims.

What is claimed is:

1. A semiconductor laser comprising:
   a semiconductor substrate;
   a first light emitting region of semiconductor layers provided on said semiconductor substrate, said semiconductor layers of first light emitting region having an active layer, determined by a first wavelength of laser beam, sandwiched between two cladding layers of which the band gap is greater than that of said active layer; and
   a second light emitting region of semiconductor layers provided on said first light emitting region, said semiconductor layers of said second light emitting region having an active layer, determined by a second wavelength of laser beam, sandwiched between two cladding layers of which the band gap is greater than that of said active layer,
   wherein said first light emitting region and said second light emitting region are aligned with each other along the perpendicular to said semiconductor substrate,
   wherein both of said first and second light emitting regions are formed of ridge structures, and
   wherein said first and second light emitting regions are joined through a contact layer and an upper electrode of said first light emitting region and a lower electrode of said second light emitting region are provided in common on an electrode forming layer which is electrically connected to said contact layer.

2. A semiconductor laser according to claim 1, wherein said ridge structures of said first and second light emitting regions are formed of the same width in a succession.

3. A semiconductor laser according to claim 1, wherein each of said ridge structures is accompanied at both sides with a current blocking layer embedded and at least said current blocking layer on the sides of said second light emitting region is formed of a hetero barrier block structure.

4. A semiconductor laser comprising:
   a semiconductor substrate of a first conductivity type;
   a first light emitting region provided on said semiconductor substrate, said first light emitting region comprising a cladding layer of the first conductivity type, an active layer, and a cladding layer of a second conductivity type;
   a first contact layer of the second conductivity type provided on said first light emitting region;
   a second light emitting region provided on said first contact layer, said second light emitting region comprising a cladding layer of the second conductivity type, an active layer, and a cladding layer of the first conductivity type;
   a recess arranged to define a ridge structure of the semiconductor layers which include said cladding layer of the second conductivity type in said first light emitting region, said first contact layer, and all the semiconductor layers in said second light emitting region;
   a first electrode forming layer of the second conductivity type embedded over a current blocking layer of said first light emitting region in the recess so as to electrically connect with said first contact layer; and
   a second contact layer of the first conductivity type electrically connected with said cladding layer of the first conductivity type in said second light emitting region and provided over another current blocking layer which is seated on a part of said first electrode forming layer, embedded in the recess to cover the sides of the ridge structure of said second light emitting region, and forms a hetero barrier blocking structure with said cladding layer of the second conductivity type and said active layer in said second light emitting region.

5. A method for manufacturing a semiconductor laser comprising the steps of:

(a) depositing on a semiconductor substrate a group of semiconductor layers incorporating a first light emitting region, a first contact layer, and another group of semiconductor layers incorporating a second light emitting region in(a)sequence;

(b) etching from the surface of said semiconductor layers to a depth in said first light emitting region to shape said first and second light emitting regions to a ridge structure which is a current injection area;

(c) depositing on both sides of said current injection area of said ridge structure shaped by said etching, a first current blocking layer for blocking a flow of current in said first light emitting region, a first electrode forming layer connected to said first contact layer, and a second current blocking layer for blocking a flow of current in said second light emitting region in a sequence;

(d) depositing a second contact layer on said another group of semiconductor layers and said second current blocking layer; and (e) etching partially said second contact layer and said second current blocking layer to expose a portion of said first electrode layer.

6. A method according to claim 5, wherein depositing said another group of semiconductor layers with the structure of at least an active layer sandwiched between, an n-type cladding layer and a p-type cladding layer, and depositing said second current blocking layer with a semiconductor having a hetero barrier blocking structure with said active layer and said n-type and p-type cladding layers, directly on both sides of said active layer and said n-type and p-type cladding layers.

* * * * *